US010005906B2

(12) United States Patent
Iimura et al.

(10) Patent No.: US 10,005,906 B2
(45) Date of Patent: Jun. 26, 2018

(54) CURABLE SILICONE COMPOSITION, AND OPTICAL SEMICONDUCTOR DEVICE

(71) Applicant: Dow Corning Toray Co., Ltd., Tokyo (JP)

(72) Inventors: Tomohiro Iimura, Ichihara (JP); Nohno Toda, Ichihara (JP); Sawako Inagaki, Ichihara (JP); Haruhiko Furukawa, Ichihara (JP)

(73) Assignee: DOW CORNING TORAY CO., LTD., Tokyo (JP)

( * ) Notice: Subject to any disclaimer, the term of this patent is extended or adjusted under 35 U.S.C. 154(b) by 42 days.

(21) Appl. No.: 15/315,745

(22) PCT Filed: May 29, 2015

(86) PCT No.: PCT/JP2015/002716
§ 371 (c)(1),
(2) Date: Feb. 16, 2017

(87) PCT Pub. No.: WO2015/186322
PCT Pub. Date: Dec. 10, 2015

(65) Prior Publication Data
US 2017/0190911 A1 Jul. 6, 2017

(30) Foreign Application Priority Data

Jun. 3, 2014 (JP) ................ 2014-114513

(51) Int. Cl.
*C08L 83/06* (2006.01)
*H01L 33/56* (2010.01)
*C08L 83/00* (2006.01)

(52) U.S. Cl.
CPC .............. *C08L 83/06* (2013.01); *C08L 83/00* (2013.01); *H01L 33/56* (2013.01)

(58) Field of Classification Search
CPC ......... C08G 77/12; C08G 77/20; C08G 77/14
See application file for complete search history.

(56) References Cited

U.S. PATENT DOCUMENTS

| | | | |
|---|---|---|---|
| 7,863,392 B2 | 1/2011 | Nakanishi et al. | |
| 8,044,162 B2 | 10/2011 | Morita et al. | |
| 8,299,186 B2 | 10/2012 | Sagawa et al. | |
| 8,614,282 B2 | 12/2013 | Hamamoto et al. | |
| 8,772,812 B2 | 7/2014 | Yoshitake et al. | |
| 8,846,828 B2 | 9/2014 | Sagawa et al. | |
| 8,933,158 B2 | 1/2015 | Shiobara et al. | |
| 9,045,641 B2 | 6/2015 | Yoshitake et al. | |
| 9,048,406 B2 | 6/2015 | Yamazaki et al. | |
| 2013/0134609 A1 | 5/2013 | Yoshitake et al. | |
| 2013/0274398 A1 | 10/2013 | Shiobara et al. | |
| 2014/0367723 A1 | 12/2014 | Yamazaki et al. | |
| 2015/0001569 A1* | 1/2015 | Yoshitake ............... | C08L 83/14 257/98 |

FOREIGN PATENT DOCUMENTS

| | | |
|---|---|---|
| CN | 103003364 A | 3/2013 |
| CN | 103374228 A | 10/2013 |
| CN | 104136545 A | 11/2014 |
| CN | 104136546 A | 11/2014 |
| EP | 2 588 538 A | 1/2012 |
| EP | 2 809 726 A | 8/2013 |
| EP | 2 809 727 A | 8/2013 |
| JP | 2007-008996 A | 1/2007 |
| JP | 2007-327019 A | 12/2007 |
| JP | 2009-235265 A | 10/2009 |
| JP | 2010-001335 A | 1/2010 |
| JP | 2010-001336 A | 1/2010 |
| JP | 2012-012434 A | 1/2012 |
| JP | 2012-052045 A | 3/2012 |
| JP | 2013-159670 A | 8/2013 |
| JP | 2013 159671 * | 8/2013 |
| JP | 2013-159671 A | 8/2013 |
| JP | 2013-221075 A | 10/2013 |
| KR | 10-2009-0103785 A | 10/2009 |
| KR | 10-2013-0112712 A | 10/2013 |
| KR | 10-2013-0116813 A | 10/2013 |
| KR | 10-2014-0128350 A | 11/2014 |
| KR | 10-2014-0130135 A | 11/2014 |
| TW | 201005040 A | 2/2010 |
| TW | 201213443 A | 4/2012 |
| TW | 201333118 A | 8/2013 |

(Continued)

OTHER PUBLICATIONS

International Search Report for Application No. PCT/JP2015/002716 dated Jun. 23, 2015, 5 pages.
English language abstract for CN 103003364 extracted from espacenet.com database on Jan. 26, 2017, 2 pages.
English language abstract for CN 103374228 extracted from espacenet.com database on Jan. 26, 2017, 2 pages.
English language abstract for CN 104136545 extracted from espacenet.com database on Jan. 26, 2017, 2 pages.
English language abstract for CN 104136546 extracted from espacenet.corn database on Jan. 26, 2017, 2 pages.
English language abstract not found for EP 2 588 538; however, see International Publication No. WO 2012/002560. Original document extracted from espacenet.com database on Jan. 26, 2017, 1 page.
English language abstract not found for EP 2 809 726; however, see International Publication No. WO 2013/115415. Original document extracted from espacenet.com database on Jan. 26, 2017, 1 page.
English language abstract not found for EP 2 809 727; however, see International Publication No. WO 2013/115416. Original document extracted from espacenet.com database on Jan. 26, 2017, 1 page.

(Continued)

*Primary Examiner* — Kuo Liang Peng
(74) *Attorney, Agent, or Firm* — Howard & Howard Attorneys PLLC

(57) ABSTRACT

A curable silicone composition comprising: (A) an organopolysiloxane having at least two alkenyl groups in a molecule; (B) an organohydrogenpolysiloxane having at least two silicon-bonded hydrogen atoms in a molecule; (C) an adhesion promoter represented by the average unit formula; and (D) a hydrosilylation reaction catalyst. Provided is a curable silicone composition for forming a transparent cured product having high adhesion to a substrate, and an optical semiconductor device having excellent reliability made using the composition.

8 Claims, 1 Drawing Sheet

(56) References Cited

FOREIGN PATENT DOCUMENTS

| TW | 201333119 A | 8/2013 |
|---|---|---|
| TW | 201402702 A | 1/2014 |
| WO | WO 2012/002560 A1 | 1/2012 |
| WO | WO 2013/115415 A1 | 8/2013 |
| WO | WO 2013/115416 A1 | 8/2013 |

OTHER PUBLICATIONS

English language abstract for JP 2007-008996 extracted from espacenet.com database on Jan. 26, 2017, 2 pages.
English language abstract for JP 2007-327019 extracted from espacenet.com database on Jan. 26, 2017, 2 pages.
English language abstract and machine-assisted English translation for JP 2009-235265 extracted from espacenet.com database on Jan. 26, 2017, 30 pages.
English language abstract for JP 2010-001335 extracted from espacenet.com database on Jan. 26, 2017, 2 pages.
English language abstract for JP 2010-001336 extracted from espacenet.com database on Jan. 26, 2017, 2 pages.
English language abstract for JP 2012-012434 extracted from espacenet.com database on Jan. 26, 2017, 2 pages.
English language abstract for JP 2012-052045 extracted from espacenet.com database on Jan. 26, 2017, 2 pages.
English language abstract for JP 2013-159670 extracted from espacenet.com database on Jan. 26, 2017, 2 pages.
English language abstract for JP 2013-159671 extracted from espacenet.com database on Jan. 26, 2017, 2 pages.
English language abstract for JP 2013-221075 extracted from espacenet.com database on Jan. 26, 2017, 2 pages.
English language abstract and machine-assisted English translation for KR 10-2009-0103785 extracted from espacenet.com database on Jan. 26, 2017, 15 pages.
English language abstract not found for KR 10-2013-0112712; however, see English language equivalent U.S. Pat. No. 8,722,812. Original document extracted from espacenet.com database on Jan. 26, 2017, 15 pages.
English language abstract for KR 10-2013-0116813 extracted from espacenet.com database on Jan. 26, 2017, 2 pages.
English language abstract not found for KR 10-2014-0128350; however, see English language equivalent U.S. Pat. No. 9,048,406. Original document extracted from espacenet.com database on Jan. 26, 2017, 18 pages.
English language abstract not found for KR 10-2014-0130135 ; however, see English language equivalent U.S. Pat. No. 9,045,641. Original document extracted from espacenet.com database on Jan. 26, 2017, 17 pages.
English language abstract of TW 201005040 and machine-assisted English translation for equivalent JP 2009-235265 extracted from espacenet.com database on Jan. 26, 2017, 29 pages.
English language abstract for TW 201213443 extracted from espacenet.com database on Jan. 26, 2017, 2 pages.
English language abstract for TW 201333118 extracted from espacenet.com database on Jan. 26, 2017, 2 pages.
English language abstract for TW 201333119 extracted from espacenet.com database on Jan. 26, 2017, 2 pages.
English language abstract for TW 201402702 extracted from espacenet.com database on Jan. 26, 2017, 2 pages.

\* cited by examiner

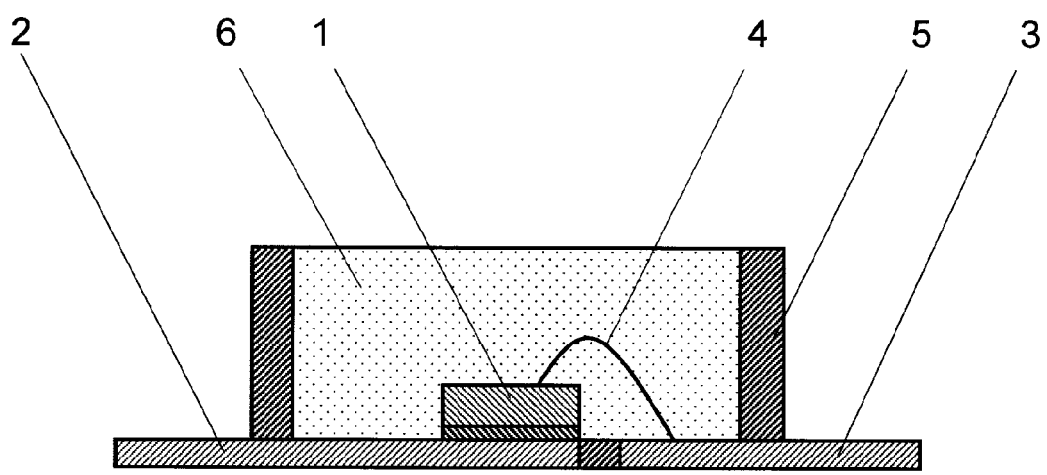

CURABLE SILICONE COMPOSITION, AND OPTICAL SEMICONDUCTOR DEVICE

CROSS-REFERENCE TO RELATED APPLICATIONS

This application is the National Stage of International Patent Application No. PCT/JP2015/002716, filed on May 29, 2015, which claims priority to and all the advantages of Japanese Patent Application No. 2014-114513, filed on Jun. 3, 2014, the content of which is incorporated herein by reference.

TECHNICAL FIELD

The present invention relates to a curable silicone composition and an optical semiconductor device made using the composition.

BACKGROUND ART

Curable silicone compositions that cure through a hydrosilylation reaction are used as protective agents or coating agents for optical semiconductor elements in optical semiconductor devices such as photocouplers, light emitting diodes, solid-state image sensing devices, and the like. In order for the above elements to emit or receive light, the cured product of such a composition must not absorb and scatter light, and furthermore, it must adhere to the above element, the lead frame, the substrate, the frame material, and the like.

For example, Patent Document 1 describes a curable silicone composition containing an organosilicon compound represented by the average unit formula:

$$[(CH_2=CH)(CH_3)_2SiO_{1/2}]_{25}(C_6H_5SiO_{3/2})_{75}[Ep(CH_3)SiO_{2/2}]_{40};$$

Patent Document 2 describes a curable silicone composition containing an organosilicon compound represented by the average unit formula:

$$[(CH_3)(C_6H_5)SiO_{2/2}]_{0.15}[(CH_3)(CH_2=CH)SiO_{2/2}]_{0.24}(EpSiO_{3/2})_{0.19}(CH_3O_{1/2})_{0.42};$$

Patent Document 3 describes a curable silicone composition containing an organosilicon compound represented by the average unit formula:

$$(C_6H_5SiO_{3/2})_{0.50}(EpSiO_{3/2})_{0.25}[(CH_2=CH)(CH_3)_2SiO_{1/2}]_{0.25};$$

Patent Document 4 describes a curable silicone composition containing an organosilicon compound represented by the average unit formula:

$$(EpSiO_{3/2})_{0.3}[(CH_2=CH)(CH_3)SiO_{2/2}]_{0.3}[(CH_3)_2SiO_{2/2}]_{0.3}(CH_3O_{1/2})^{0.2}; \text{ and}$$

Patent Document 5 describes a curable silicone composition containing an organosilicon compound represented by the average unit formula:

$$[(CH_2=CH)(CH_3)SiO_{2/2}]_{0.2}[(C_6H_5)_2SiO_{2/2}]_{0.5}(EpSiO_{3/2})_{0.3}.$$

In the above formulas, Ep denotes a 3-glycidoxypropyl group.

However, these curable silicone compositions have the problems that light transmittance of the cured product obtained by curing is low and adhesion of the cured product to a substrate is poor.

CITATION LIST

Patent Literature

Patent Document 1: Japanese Unexamined Patent Application Publication No. 2007-008996A
Patent Document 2: Japanese Unexamined Patent Application Publication No. 2007-327019A
Patent Document 3: Japanese Unexamined Patent Application Publication No. 2010-001335A
Patent Document 4: Japanese Unexamined Patent Application Publication No. 2010-001336A
Patent Document 5: Japanese Unexamined Patent Application Publication No. 2012-052045A

SUMMARY OF INVENTION

Technical Problem

An object of the present invention is to provide a curable silicone composition for forming a transparent cured product having high adhesion to a substrate, and to provide an optical semiconductor device that has excellent reliability made using the composition.

Solution to Problem

The curable silicone composition of the present invention comprises:

(A) 100 parts by mass of an organopolysiloxane having at least two alkenyl groups in a molecule;

(B) an organohydrogenpolysiloxane having at least two silicon-bonded hydrogen atoms in a molecule, in an amount providing from 0.1 to 10.0 moles of silicon-bonded hydrogen atoms relative to 1 mole of total alkenyl groups contained in components (A) and (C);

(C) from 0.1 to 50 parts by mass of an adhesion promoter represented by the average unit formula:

$$(R^1R^2SiO_{2/2})_a(R^2R^3SiO_{2/2})_b(R^4SiO_{3/2})_c$$

wherein, $R^1$ is an alkenyl group having from 2 to 12 carbons; $R^2$ are the same or different alkyl groups having from 1 to 12 carbons, aryl groups having from 6 to 20 carbons, or aralkyl groups having from 7 to 20 carbons; $R^3$ is an epoxy group-containing organic group; $R^4$ is an aryl group having from 6 to 20 carbons or an aralkyl group having from 7 to 20 carbons; and a, b, and c are numbers satisfying: $0.1 \leq a \leq 0.6$, $0.1 \leq b \leq 0.5$, $0.3 \leq c < 0.8$, $0.15 \leq a/c \leq 1.5$, $0.15 \leq b/c \leq 1.8$, and $a+b+c=1$; and (D) a hydrosilylation reaction catalyst in an amount effective in accelerating curing of the composition.

The optical semiconductor device of the present invention is produced by encapsulating an optical semiconductor element with a cured product of the curable silicone composition described above.

Effects of Invention

A feature of the curable silicone composition of the present invention is that it forms a transparent cured product having high adhesion to a substrate. Also, the optical semiconductor device of the present invention has the feature of excellent reliability because the optical semiconductor element is encapsulated by the cured product of the composition.

BRIEF DESCRIPTION OF DRAWINGS

FIG. 1 is a cross-sectional view of an LED that is an example of an optical semiconductor device of the present invention.

DETAILED DESCRIPTION OF THE INVENTION

First, a curable silicone composition of the present invention will be described in detail.

Component (A) is the base compound of the present composition and is an organopolysiloxane having at least two alkenyl groups in a molecule. Examples of the alkenyl groups in component (A) include alkenyl groups having from 2 to 12 carbons such as a vinyl group, allyl group, butenyl group, pentenyl group, hexenyl group, heptenyl group, octenyl group, nonenyl group, decenyl group, undecenyl group, and dodecenyl group, and a vinyl group is preferred. Examples of the group bonding to the silicon atom other than alkenyl groups of component (A) include alkyl groups having from 1 to 12 carbons, such as a methyl group, ethyl group, propyl group, isopropyl group, butyl group, isobutyl group, tert-butyl group, pentyl group, neopentyl group, hexyl group, cyclohexyl group, heptyl group, octyl group, nonyl group, decyl group, undecyl group, and dodecyl group; aryl groups having from 6 to 20 carbons, such as a phenyl group, tolyl group, xylyl group, and naphthyl group; aralkyl groups having from 7 to 20 carbons, such as a benzyl group, phenethyl group, and phenylpropyl group; and groups in which some or all of the hydrogen atoms bonded in these groups are substituted with halogen atoms, such as a fluorine atom, chlorine atom, and bromine atom. Furthermore, the silicon atoms in component (A) may have a small amount of alkoxy groups such as hydroxy groups, methoxy groups, ethoxy groups, and the like, at levels that do not impair the object of the present invention.

There is no particular limitation on the molecular structure of component (A); examples include straight chain, partially branched straight chain, branched chain, cyclic, and three-dimensional network structures. Component (A) may be one type of organopolysiloxane having these molecular structures or may be a mixture of two or more types of organopolysiloxane having these molecular structures.

The state of component (A) at 25° C. is not particularly limited. For example, it may be a liquid or a solid. If component (A) is a liquid at 25° C., the viscosity of the liquid at 25° C. is preferably in the range of 1 to 1,000,000 mPa·s, and particularly preferably in the range of 10 to 1,000,000 mPa·s. The viscosity at 25° C. may be determined by, for example, measurement using a B type viscometer in accordance with JIS K 7117-1.

This type of component (A) preferably contains an organopolysiloxane resin having at least two alkenyl groups in a molecule and represented by the average unit formula:

$(R^1R^5{}_2SiO_{1/2})_d(R^5{}_2SiO_{2/2})_e(R^4SiO_{3/2})_f$

In the formula, $R^1$ is an alkenyl group having from 2 to 12 carbons. Specific examples include a vinyl group, allyl group, butenyl group, pentenyl group, hexenyl group, heptenyl group, octenyl group, nonenyl group, decenyl group, undecenyl group, and dodecenyl group.

In the formula, $R^4$ is an aryl group having from 6 to 20 carbons or an aralkyl group having from 7 to 20 carbons. Specific examples include aryl groups such as a phenyl group, tolyl group, xylyl group, naphthyl group, anthracenyl group, phenanthryl group, and pyrenyl group; aralkyl groups such as a naphthyl ethyl group, naphthyl propyl group, anthracenyl ethyl group, phenanthryl ethyl group, and pyrenyl ethyl group; and groups in which some or all of the hydrogen atoms of these aryl groups or aralkyl groups are substituted with alkyl groups such as a methyl group or ethyl group; alkoxy groups such as a methoxy group or ethoxy group; and halogen atoms such as a chlorine atom or bromine atom.

In the formula, $R^5$ are the same or different alkyl groups having from 1 to 12 carbons, alkenyl groups having from 2 to 12 carbons, aryl groups having from 6 to 20 carbons, or aralkyl groups having from 7 to 20 carbons. Specific examples include alkyl groups, such as a methyl group, ethyl group, propyl group, butyl group, pentyl group, hexyl group, heptyl group, octyl group, nonyl group, decyl group, undecyl group, and dodecyl group; alkenyl groups, such as a vinyl group, allyl group, butenyl group, pentenyl group, hexenyl group, heptenyl group, octenyl group, nonenyl group, decenyl group, undecenyl group, and dodecenyl group; aryl groups, such as a phenyl group, tolyl group, xylyl group, naphthyl group, anthracenyl group, phenanthryl group, and pyrenyl group; aralkyl groups, such as a naphthylethyl group, naphthylpropyl group, anthracenylethyl group, phenanthrylethyl group, and pyrenylethyl group; and groups in which some or all of the hydrogen atoms bonded in these aryl groups or aralkyl groups are substituted with an alkyl group such as a methyl group or an ethyl group, an alkoxy group such as a methoxy group or an ethoxy group, or halogen atoms such as a chlorine atom and bromine atom.

In the formula, d, e, and f are numbers satisfying: $0.01 \leq d \leq 0.5$, $0 \leq e \leq 0.7$, $0.1 \leq f < 0.9$, and $d+e+f=1$, and are preferably numbers satisfying: $0.1 \leq d \leq 0.4$, $0 \leq e \leq 0.5$, $0.4 \leq f < 0.9$, and $d+e+f=1$. This is because when d is not less than the lower limit of the range described above, curability of the obtained composition is good, while on the other hand, when d is not greater than the upper limit of the range described above, the strength of the obtained cured product is improved. This is also because when e is not greater than the upper limit of the range described above, the flexibility of the obtained cured product is improved. Further, it is because when f is not less than the lower limit of the range described above, the transparency of the obtained cured product is improved, while on the other hand, when f is not greater than the upper limit of the range described above, handleability of this component is improved.

Furthermore, component (A) preferably contains a straight-chain organopolysiloxane having at least two silicon-bonded alkenyl groups and at least one silicon-bonded aryl group in a molecule.

Examples of this type of component (A) include organopolysiloxanes such as those mentioned below. Note that, in the formulas, Me represents a methyl group, Vi represents a vinyl group, Ph represents a phenyl group, and x and x' are each an integer from 1 to 100.

$ViPhMeSiO(Me_2SiO)_xSiMePhVi$ $ViPh_2SiO(Me_2SiO)_xSiPh_2Vi$ $ViMe_2SiO(Me_2SiO)_x(Ph_2SiO)_{x'}SiMe_2Vi$ $ViPhMeSiO(Me_2SiO)_x(Ph_2SiO)_{x'}SiPhMeVi$ $ViPh_2SiO(Me_2SiO)_x(Ph_2SiO)_{x'}SiPh_2Vi$ $ViMe_2SiO(MePhSiO)_xSiMe_2Vi$ $MePhViSiO(MePhSiO)_xSiMePhVi$

Ph$_2$ViSiO(MePhSiO)$_x$SiPh$_2$Vi

ViMe$_2$SiO(Ph$_2$SiO)$_x$(PhMeSiO)$_x$SiMe$_2$Vi

ViPhMeSiO(Ph$_2$SiO)$_x$(PhMeSiO)$_x$SiPhMeVi

ViPh$_2$SiO(Ph$_2$SiO)$_x$(PhMeSiO)$_x$SiPh$_2$Vi

Component (B) is a crosslinking agent of the present composition and is an organopolysiloxane having at least two silicon-bonded hydrogen atoms in a molecule. Examples of the molecular structure of component (B) include straight chain, partially branched straight chain, branched chain, cyclic, and dendritic structures. Of these, straight chain, partially branched straight chain, and dendritic structures are preferable. The bonding positions of the silicon-bonded hydrogen atoms in component (B) are not particularly limited, and examples thereof include a molecular terminal(s) and/or side chain(s) of the molecule. Examples of the group bonding to the silicon atom other than hydrogen atoms of component (B) include alkyl groups such as a methyl group, ethyl group, and propyl group; aryl groups such as a phenyl group, tolyl group, and xylyl group; aralkyl groups such as a benzyl group and phenethyl group; and halogenated alkyl groups such as a 3-chloropropyl group and 3,3,3-trifluoropropyl group. A methyl group or phenyl group is preferred. Although no limitation is placed on the viscosity of component (B), at 25° C., it is preferably in the range of 1 to 10,000 mPa·s, and particularly preferably in the range of 1 to 1,000 mPa·s.

Examples of component (B) include 1,1,3,3-tetramethyldisiloxane, 1,3,5,7-tetramethylcyclotetrasiloxane, tris(dimethylhydrogensiloxy)methylsilane, tris(dimethylhydrogensiloxy)phenylsilane, 1-glycidoxypropyl-1,3,5,7-tetramethylcyclotetrasiloxane, 1,5-diglycidoxypropyl-1,3,5,7-tetramethylcyclotetrasiloxane, 1-glycidoxypropyl-5-trimethoxysilylethyl-1,3,5,7-tetramethylcyclotetrasiloxane, methylhydrogenpolysiloxane capped at both molecular terminals with trimethylsiloxy groups, dimethyl siloxane-methylhydrogensiloxane copolymers capped at both molecular terminals with trimethylsiloxy groups, dimethylpolysiloxane capped at both molecular terminals with dimethylhydrogensiloxy groups, dimethyl siloxane-methylhydrogensiloxane copolymers capped at both molecular terminals with dimethylhydrogensiloxy groups, methylhydrogensiloxane-diphenylsiloxane copolymers capped at both molecular terminals with trimethylsiloxy groups, methylhydrogensiloxane-diphenylsiloxane-dimethylsiloxane copolymers capped at both molecular terminals with trimethylsiloxy groups, hydrolysis condensates of trimethoxysilane, copolymers comprising (CH$_3$)$_2$HSiO$_{1/2}$ units and SiO$_{4/2}$ units, and copolymers comprising (CH$_3$)$_2$HSiO$_{1/2}$ units, SiO$_{4/2}$ units, and (C$_6$H$_5$)SiO$_{3/2}$ units, as well as the following organosiloxanes. Note that, in the formulas, Me represents a methyl group, Vi represents a vinyl group, Ph represents a phenyl group, Naph represents a naphthyl group, y and y' are each an integer from 1 to 100, and g, h, i, and j are each a positive number, where the total of g, h, i, and j is 1.

HMe$_2$SiO(Ph$_2$SiO)$_y$SiMe$_2$H

HMePhSiO(Ph$_2$SiO)$_y$SiMePhH

HMeNaphSiO(Ph$_2$SiO)$_y$SiMeNaphH

HMePhSiO(Ph$_2$SiO)$_y$(MePhSiO)$_{y'}$SiMePhH

HMePhSiO(Ph$_2$SiO)$_y$(Me$_2$SiO)$_{y'}$SiMePhH (HMe$_2$SiO$_{1/2}$)$_g$(PhSiO$_{3/2}$)$_h$ (HMePhSiO$_{1/2}$)$_g$(PhSiO$_{3/2}$)$_h$ (HMePhSiO$_{1/2}$)$_g$(NaphSiO$_{3/2}$)$_h$ (HMe$_2$SiO$_{1/2}$)$_g$(NaphSiO$_{3/2}$)$_h$ (HMePhSiO$_{1/2}$)$_g$(HMe$_2$SiO$_{1/2}$)$_h$(PhSiO$_{3/2}$)$_i$ (HMe$_2$SiO$_{1/2}$)$_g$(Ph$_2$SiO$_{2/2}$)$_h$(PhSiO$_{3/2}$)$_i$ (HMePhSiO$_{1/2}$)$_g$(HMe$_2$SiO$_{2/2}$)$_h$(PhSiO$_{3/2}$)$_i$ (HMe$_2$SiO$_{1/2}$)$_g$(Ph$_2$SiO$_{2/2}$)$_h$(NaphSiO$_{3/2}$)$_i$ (HMePhSiO$_{1/2}$)$_g$(Ph$_2$SiO$_{2/2}$)$_h$(NaphSiO$_{3/2}$)$_i$ (HMePhSiO$_{1/2}$)$_g$(HMe$_2$SiO$_{1/2}$)$_h$(NaphSiO$_{3/2}$)$_i$ (HMePhSiO$_{1/2}$)$_g$(HMe$_2$SiO$_{1/2}$)$_h$(Ph$_2$SiO$_{2/2}$)$_i$(NaphSiO$_{3/2}$)$_j$ (HMePhSiO$_{1/2}$)$_g$(HMe$_2$SiO$_{1/2}$)$_h$(Ph$_2$SiO$_{2/2}$)$_i$(PhSiO$_{3/2}$)$_j$ A content of component (B) is a quantity whereby the amount of silicon-bonded hydrogen atoms in this component is from 0.1 to 10.0 moles, preferably from 0.1 to 5 moles, and more preferably from 0.5 to 2 moles, per 1 mole of total alkenyl groups in components (A) and (C). This is because, when the content of component (B) is not less than the lower limit of the range described above, the obtained composition is cured sufficiently, while on the other hand, when the content is not greater than the upper limit of the range described above, heat resistance of the obtained cured product is enhanced, and reliability of an optical semiconductor device produced using this composition is thus enhanced.

Component (C) is an adhesion promoter for imparting adhesion to the present composition, and is represented by the average unit formula:

(R$^1$R$^2$SiO$_{2/2}$)$_a$(R$^2$R$^3$SiO$_{2/2}$)$_b$(R$^4$SiO$_{3/2}$)$_c$.

In the formula, R$^1$ is an alkenyl group having from 2 to 12 carbons. Specific examples include a vinyl group, allyl group, butenyl group, pentenyl group, hexenyl group, heptenyl group, octenyl group, nonenyl group, decenyl group, undecenyl group, and dodecenyl group. Of these, a vinyl group is preferable.

In the formula, R$^2$ may be the same or different and are each an alkyl group having from 1 to 12 carbons, an aryl group having from 6 to 20 carbons, or an aralkyl group having from 7 to 20 carbons. Specific examples thereof include alkyl groups, such as a methyl group, ethyl group, propyl group, butyl group, pentyl group, hexyl group, heptyl group, octyl group, nonyl group, decyl group, undecyl group, and dodecyl group; alkenyl groups, such as a vinyl group, allyl group, butenyl group, pentenyl group, hexenyl group, heptenyl group, octenyl group, nonenyl group, decenyl group, undecenyl group, and dodecenyl group; aryl groups, such as a phenyl group, tolyl group, xylyl group, naphthyl group, anthracenyl group, phenanthryl group, and pyrenyl group; aralkyl groups, such as a naphthylethyl group, naphthylpropyl group, anthracenylethyl group, phenanthrylethyl group, and pyrenylethyl group; and groups in which some or all of the hydrogen atoms bonded in these aryl groups or aralkyl groups are substituted with an alkyl group such as a methyl group or an ethyl group, an alkoxy group such as a methoxy group or an ethoxy group, or halogen atoms such as a chlorine atom and bromine atom. A methyl group, vinyl group, or phenyl group is preferred.

In the formula, $R^3$ is an epoxy group-containing organic group. Specific examples include glycidoxyalkyl groups such as a 2-glycidoxyethyl group, 3-glycidoxypropyl group, or 4-glycidoxybutyl group; epoxycycloalkylalkyl groups such as a 2-(3,4-epoxycyclohexyl)-ethyl group or 3-(3,4-epoxycyclohexyl)-propyl group; and epoxyalkyl groups such as a 3,4-epoxybutyl group or 7,8-epoxyoctyl group. Glycidoxyalkyl groups are preferable, and a 3-glycidoxypropyl group is particularly preferable.

In the formula, $R^4$ is an aryl group having from 6 to 20 carbons or an aralkyl group having from 7 to 20 carbons, and examples thereof include the same groups described for the aforementioned $R^2$.

In the formula, a, b, and c are numbers satisfying: $0.1 \leq a \leq 0.6$, $0.1 \leq b \leq 0.5$, $0.3 \leq c < 0.8$, $0.15 \leq a/c \leq 1.5$, $0.15 \leq b/c \leq 1.8$, and $a+b+c=1$, and are preferably numbers satisfying: $0.2 \leq a \leq 0.6$, $0.1 \leq b \leq 0.45$, $0.3 \leq c < 0.7$, $0.15 \leq a/c \leq 1.5$, $0.15 \leq b/c \leq 1.8$, and $a+b+c=1$, and are more preferably numbers satisfying: $0.2 \leq a \leq 0.5$, $0.1 \leq b \leq 0.4$, $0.3 \leq c < 0.65$, $0.15 \leq a/c \leq 1.5$, $0.15 \leq b/c \leq 1.8$, and $a+b+c=1$. This is because, when the value of a is not less than the lower limit of the range described above, the obtained cured product is not likely to be sticky, while on the other hand, when it is not greater than the upper limit of the range described above, the obtained cured product has excellent adhesion. This is also because when the value of b is not less than the lower limit of the range described above, adhesion of the obtained cured product is good, while on the other hand, when it is not greater than the upper limit of the range described above, heat resistance of the obtained cured product is improved. This is also because when the value of c is not less than the lower limit of the range described above, the refractive index of the obtained cured product is good. This is also because when the value of a/c is not less than the lower limit of the range described above, adhesion of the obtained cured product is good, while on the other hand, when a/c is not greater than the upper limit of the range described above, curability of the obtained composition is good. This is also because when the value of b/c is not less than the lower limit of the range described above, adhesion of the obtained cured product is good, while on the other hand, when it is not greater than the upper limit of the range described above, heat resistance of the obtained cured product is good.

Component (C) is expressed by the average unit formula described above but may also have siloxane units represented by the formula: $R^5{}_3SiO_{1/2}$, siloxane units represented by the formula: $R^6SiO_{3/2}$, or siloxane units represented by the formula: $SiO_{4/2}$, within a range that does not impair the object of the present invention. In the formula, $R^5$ are the same or different alkyl groups having from 1 to 12 carbons, aryl groups having from 6 to 20 carbons, or aralkyl groups having from 7 to 20 carbons. Examples of the alkyl groups, aryl groups, and aralkyl groups of $R^5$ include the same alkyl groups, aryl groups, and aralkyl groups described for the aforementioned $R^2$. In the formula, $R^6$ is an alkyl group having from 1 to 12 carbons or an alkenyl group having from 2 to 12 carbons. Examples of the alkyl groups of $R^6$ include the same alkyl groups described for the aforementioned $R^2$. Examples of the alkenyl groups of $R^6$ include the same alkenyl groups described for the aforementioned $R^1$. Furthermore, component (C) may contain silicon-bonded alkoxy groups, such as methoxy groups, ethoxy groups, or propoxy groups, or silicon-bonded hydroxyl groups as long as the objective of the present invention is not impaired.

The method of preparing this type of component (C) is not particularly limited, and examples include a hydrolysis-condensation reaction of a silane compound represented by the general formula (I-1):

$$R^1R^2SiX_2$$

or a cyclic silicone compound represented by the general formula (I-2):

$$(R^1R^2SiO)_m,$$

a silane compound represented by the general formula (II):

$$R^2R^3SiX_2,$$

and a silane compound represented by the general formula (III):

$$R^4SiX_3$$

in the presence of an acid or an alkali.

The silane compound represented by the general formula (I-1) is a raw material for introducing siloxane units represented by the formula: $R^1R^2SiO_{2/2}$ into component (C). In the formula, $R^1$ is an alkenyl group having from 2 to 12 carbons, examples of which are the same as the groups described above. Of those, a vinyl group is preferable. In the formula, $R^2$ are the same or different alkyl groups having from 1 to 12 carbons, aryl groups having from 6 to 20 carbons, or aralkyl groups having from 7 to 20 carbons, examples of which are the same groups as those described above. Of those, a methyl group is preferable. In the formula, X are the same or different alkoxy groups, acyloxy groups, halogen atoms, or hydroxyl groups. Examples of the alkoxy group of X include a methoxy group, an ethoxy group, and a propoxy group. Examples of the acyloxy group of X include an acetoxy group. Examples of the halogen atom of X include a chlorine atom and a bromine atom.

Examples of such a silane compound include alkoxysilanes such as vinylmethyldimethoxysilane, phenylvinyldimethoxysilane, vinylmethyldiethoxysilane, and phenylvinyldiethoxysilane; acyloxysilanes such as vinylmethyldiacetoxysilane and phenylvinyldiacetoxysilane; halosilanes such as vinylmethyldichlorosilane and phenylvinyldichlorosilane; and hydroxysilanes such as vinylmethyldihydroxysilane.

The cyclic silicone compound represented by the general formula (I-2) is a raw material for introducing siloxane units represented by the formula: $R^1R^2SiO_{2/2}$ into component (C). In the formula, $R^1$ is an alkenyl group having from 2 to 12 carbons, examples of which are the same as the groups described above. Of those, a vinyl group is preferable. In the formula, $R^2$ is an alkyl group having from 1 to 12 carbons, an aryl group having from 6 to 20 carbons, or an aralkyl group having from 7 to 20 carbons, examples of which are the same as the groups described above. Of those, a methyl group is preferable.

Examples of such a cyclic silicone compound include vinylmethylcyclosiloxane and phenylvinylcyclosiloxane.

The silane compound represented by the general formula (II) is a raw material for introducing siloxane units represented by the formula: $R^2R^3SiO_{2/2}$ into component (C). In the formula, $R^2$ is an alkyl group having from 1 to 12 carbons, an aryl group having from 6 to 20 carbons, or an aralkyl group having from 7 to 20 carbons, examples of which are the same as the groups described above. Of those, a vinyl group is preferable. In the formula, $R^3$ is an epoxy group-containing organic group, examples of which are the same as the groups described above.

Examples of such a silane compound include 3-glycidoxypropyl methyldimethoxysilane, 4-glycidoxybutyl methyldimethoxysilane, epoxycyclohexyl)-ethyldimethoxysilane, 3-(3,4-epoxycyclohexyl)-propyldimethoxysilane, 3-glycidoxypropyl methyldiethoxysilane, 4-glycidoxybutyl methyldiethoxysilane, 2-(3,4-epoxycyclohexyl)-ethyldiethoxysilane, and 3-(3,4-epoxycyclohexyl)-propyldiethoxysilane.

The silane compound represented by the general formula (III) is a raw material for introducing siloxane units represented by the formula: $R^4SiO_{3/2}$ into component (C). In the formula, $R^4$ is an aryl group having from 6 to 20 carbons or an aralkyl group having from 7 to 20 carbons, examples of which are the same as the groups described above. Of those, a phenyl group is preferable.

Examples of such a silane compound include alkoxy silanes such as phenyl trimethoxysilane, naphthyl trimethoxysilane, anthracenyl trimethoxysilane, phenanthryl trimethoxysilane, pyrenyl trimethoxysilane, phenyl triethoxysilane, naphthyl triethoxysilane, anthracenyl triethoxysilane, phenanthryl triethoxysilane, and pyrenyl triethoxysilane; acyloxysilanes such as phenyl triacetoxysilane, naphthyl triacetoxysilane, anthracenyl triacetoxysilane, phenanthryl triacetoxysilane, and pyrenyl triacetoxysilane; halosilanes such as phenyl trichlorosilane, naphthyl trichlorosilane, anthracenyl trichlorosilane, phenanthryl trichlorosilane, and pyrenyl trichlorosilane; and hydroxysilanes such as phenyl trihydroxysilane, naphthyl trihydroxysilane, anthracenyl trihydroxysilane, phenanthryl trihydroxysilane, and pyrenyl trihydroxysilane.

The preparation method is characterized by performing a hydrolysis-condensation reaction of the silane compound (I-1) or the cyclic silicone compound (I-2), the silane compound (II), and the silane compound (III) in the presence of an acid or an alkali.

Examples of the above acid include hydrochloric acid, acetic acid, formic acid, nitric acid, oxalic acid, sulfuric acid, phosphoric acid, polyphosphoric acid, polyvalent carboxylic acid, trifluoromethane sulfonic acid, and ion exchange resins. Furthermore, examples of the above alkali include inorganic alkalis, such as potassium hydroxide and sodium hydroxide; and organic base compounds, such as triethylamine, diethylamine, monoethanolamine, diethanolamine, triethanolamine, ammonia water, tetramethylammonium hydroxide, alkoxysilanes having an amino group, and aminopropyltrimethoxysilane.

Furthermore, an organic solvent may be used in the preparation method described above. The utilized organic solvent is exemplified by ethers, ketones, acetates, aromatic or aliphatic hydrocarbons, and a γ-butyrolactone; and mixtures of two or more types of such solvents. Preferred organic solvents are exemplified by propylene glycol monomethyl ether, propylene glycol monomethyl ether acetate, propylene glycol monoethyl ether, propylene glycol monopropyl ether, propylene glycol monobutyl ether, propylene glycol mono-t-butyl ether, γ-butyrolactone, toluene, and xylene.

In order to accelerate the hydrolysis and condensation reaction of each of the components in the preparation method, water or a mixed solution of water and alcohol is preferably added. Methanol and ethanol are preferred as examples of the alcohol. If an organic solvent is used and this reaction is promoted by heating, the reaction is preferably performed at the reflux temperature of the organic solvent.

The content of component (C) is within the range of 0.1 to 50 parts by mass, and preferably in the range of 0.1 to 20 parts by mass, relative to 100 parts by mass of component (A). This is because when the content of component (C) is not less than the lower limit of the range described above, sufficient adhesion can be imparted to the obtained composition, while on the other hand, when it is not greater than the upper limit of the range described, the curability of the obtained composition is unlikely to be inhibited, and discoloration and the like of the obtained cured product can be suppressed.

Component (D) is a hydrosilylation reaction catalyst for accelerating the curing of this composition, and examples include platinum-based catalysts, rhodium-based catalysts, and palladium-based catalysts. Particularly, component (D) is preferably a platinum-based catalyst so that the curing of the present composition can be dramatically accelerated. Examples of the platinum-based catalyst include a platinum fine powder, chloroplatinic acid, an alcohol solution of chloroplatinic acid, a platinum-alkenylsiloxane complex, a platinum-olefin complex and a platinum-carbonyl complex, and a platinum-alkenylsiloxane complex is preferred.

The content of component (D) is an effective amount for accelerating the curing of the composition. Specifically, in order to be able to sufficiently accelerate the curing reaction of this composition, the content of component (D) is preferably an amount such that the catalyst metal in component (D) is in the range of 0.01 to 500 ppm, more preferably in the range of 0.01 to 100 ppm, and particularly preferably in the range of 0.01 to 50 ppm in mass units with respect to this composition.

A reaction inhibitor, for example, an alkyne alcohol such as 2-methyl-3-butyn-2-ol, 3,5-dimethyl-1-hexyn-3-ol, and 2-phenyl-3-butyn-2-ol; an ene-yne compound such as 3-methyl-3-penten-1-yne, and 3,5-dimethyl-3-hexen-1-yne; or 1,3,5,7-tetramethyl-1,3,5,7-tetravinylcyclotetrasiloxane, 1,3,5,7-tetramethyl-1,3,5,7-tetrahexenylcyclotetrasiloxane, or a benzotriazole may be incorporated as an optional component in the present composition. The content of the reaction inhibitor in the present composition is not particularly limited, but is preferably from 0.0001 to 5 parts by mass per 100 parts by mass total of components (A) to (C).

This composition may also contain an adhesion promoter other than component (C) in order to improve adhesion of the cured product to the substrate that the cured product contacts during the course of curing. Preferred adhesion promoters are organosilicon compounds having at least one alkoxy group bonded to a silicon atom in a molecule. This alkoxy group is exemplified by a methoxy group, an ethoxy group, a propoxy group, a butoxy group, and a methoxyethoxy group; and a methoxy group is particularly preferred. Furthermore, examples of other groups, excluding the alkoxy group bonded to the silicon atom, of the organosilicon compound include substituted or unsubstituted monovalent hydrocarbon groups, such as an alkyl group, alkenyl group, aryl group, aralkyl group, and halogenated alkyl group; glycidoxyalkyl groups, such as a 3-glycidoxypropyl group and 4-glycidoxybutyl group; epoxycyclohexylalkyl groups, such as a 2-(3,4-epoxycyclohexyl)ethyl group and 3-(3,4-epoxycyclohexyl)propyl group; epoxyalkyl groups, such as a 3,4-epoxybutyl group and 7,8-epoxyoctyl group; acrylic group-containing monovalent organic groups, such as a 3-methacryloxypropyl group; and a hydrogen atom. This organosilicon compound preferably has a silicon-bonded alkenyl group or silicon-bonded hydrogen atom. Moreover, due to the ability to impart good adhesion with respect to various types of substrates, this organosilicon compound preferably has at least one epoxy group-containing monovalent organic group in a molecule. This type of organosilicon compound is exemplified by organosilane compounds, organosiloxane oligomers, and alkyl silicates. Examples of the molecular structure of the organosiloxane oligomer or alkyl silicate include a straight chain structure, partially branched straight chain structure, branched chain structure, cyclic structure, and reticulated structure. A straight chain structure, branched chain structure, and reticulated structure are particularly preferred. Examples of this type of organosilicon compound include silane compounds such as 3-glycidoxypropyltrimethoxysilane, 2-(3,4-epoxycyclohexyl)ethyltrimethoxysilane, and 3-methacryloxy propyltrimethoxysilane; siloxane compounds having at least one of silicon-bonded alkenyl groups and silicon-bonded hydrogen atoms, and at least one silicon-bonded alkoxy group in a molecule; mixtures of a silane compound or siloxane compound having at least one silicon-bonded alkoxy group and a siloxane compound having at least one silicon-bonded hydroxyl group and at least one silicon-bonded alkenyl group in a molecule; and methyl polysilicate, ethyl polysilicate, and epoxy group-containing ethyl polysilicate.

Furthermore, the present composition may also contain a fluorescent substance that is used to obtain light of a desired wavelength by altering the wavelength of light emitted from a light emitting element that is encapsulated or covered with the cured product of the present composition. Examples of this type of fluorescent substance include yellow, red, green, and blue light emitting fluorescent substances consisting of oxide fluorescent substances, oxynitride fluorescent substances, nitride fluorescent substances, sulfide fluorescent substances, oxysulfide fluorescent substances, or the like, which are widely used in light emitting diodes (LEDs). Examples of oxide-based fluorescent substances include yttrium, aluminum, and garnet-type YAG green to yellow light-emitting fluorescent substances containing cerium ions; terbium, aluminum, and garnet-type TAG yellow light-emitting fluorescent substances containing cerium ions; and silicate green to yellow light-emitting fluorescent substances containing cerium or europium ions. Examples of oxynitride-based fluorescent substances include silicon, aluminum, oxygen, and nitrogen-type SiAlON red to green light-emitting fluorescent substances containing europium ions. Examples of nitride-based fluorescent substances include calcium, strontium, aluminum, silicon, and nitrogen-type CASN red light-emitting fluorescent substances containing europium ions. Examples of sulfide-based fluorescent substances include ZnS green light-emitting fluorescent substances containing copper ions or aluminum ions. Examples of oxysulfide-based fluorescent substances include $Y_2O_2S$ red light-emitting fluorescent substances containing europium ions. These fluorescent substances may be used as one type or as a mixture of two or more types. In the present composition, the content of the fluorescent substance is from 0.1 to 70 mass %, and preferably from 1 to 20 mass %, relative to the total amount of components (A) and (B).

Moreover, an inorganic filler such as silica, glass, alumina or zinc oxide; an organic resin fine powder of a polymethacrylate resin and the like; a heat-resistant agent, a dye, a pigment, a flame retardant, a solvent and the like may be incorporated as optional components in the present composition at levels that do not impair the object of the present invention.

Of the components added as optional components, in order to sufficiently suppress the discoloration of the silver electrodes or the silver plating of the substrate in the optical semiconductor device due to sulfur-containing gas in the air, it is possible to add at least one type of a fine powder having an average particle size from 0.1 nm to 5 μm selected from a group comprising zinc oxide fine powders surface-coated with at least one type of oxide of an element selected from a group comprising Al, Ag, Cu, Fe, Sb, Si, Sn, Ti, Zr, and rare earth elements, zinc oxide fine powders surface-treated with organosilicon compounds not having alkenyl groups, and hydrate fine powders of zinc carbonate.

In a zinc oxide fine powder surface-coated with an oxide, examples of rare earth elements include yttrium, cerium, and europium. Examples of the oxide on the surface of the zinc oxide fine powder include $Al_2O_3$, $AgO$, $Ag_2O$, $Ag_2O_3$, $CuO$, $Cu_2O$, $FeO$, $Fe_2O_3$, $Fe_3O_4$, $Sb_2O_3$, $SiO_2$, $SnO_2$, $Ti_2O_3$, $TiO_2$, $Ti_3O_5$, $ZrO_2$, $Y_2O_3$, $CeO_2$, $Eu_2O_3$, and mixtures of two or more of these oxides.

In a zinc oxide powder surface-treated with an organosilicon compound, the organosilicon compound does not have alkenyl groups, and examples include organosilanes, organosilazanes, polymethylsiloxanes, organohydrogenpolysiloxanes, and organosiloxane oligomers. Specific examples include organochlorosilanes such as trimethylchlorosilane, dimethylchlorosilane, and methyltrichlorosilane; organotrialkoxysilanes such as methyltrimethoxysilane, methyltriethoxysi lane, phenyltrimethoxysilane, ethyltrimethoxysilane, n-propyltrimethoxysilane, and γ-methacryloxypropyltrimethoxysilane; diorganodialkoxysilanes such as dimethyldimethoxysilane, dimethyldiethoxysilane, and diphenyldimethoxysilane; triorganoalkoxysilanes such as trimethylmethoxysilane and trimethylethoxysilane; partial condensates of these organoalkoxysilanes; organosilazanes such as hexamethyldisilazane; and resin-like organopolysiloxanes containing a polymethylsiloxane, an organohydrogenpolysiloxane, an organosiloxane oligomer having a silanol group or an alkoxy group, an $R^6SiO_{3/2}$ unit (wherein $R^6$ is a monovalent hydrocarbon group excluding alkenyl groups, examples of which include alkyl groups such as a methyl group, ethyl group, or propyl group, and aryl groups such as a phenyl group), or an $SiO_{4/2}$ unit.

In addition, the composition may also contain a triazole-based compound as an optional component to enable the further suppression of the discoloration of the silver electrodes or the silver plating of the substrate due to a sulfur-containing gas in the air. Examples of such components include 1H-1,2,3-triazole, 2H-1,2,3-triazole, 1H-1,2,4-triazole, 4H-1,2,4-triazole, 2-(2'-hydroxy-5'-methylphenyl)benzotriazole, 1H-1,2,3-triazole, 2H-1,2,3-triazole, 1H-1,2,4-triazole, 4H-1,2,4-triazole, benzotriazole, tolyltriazole, carboxybenzotriazole, 1H-benzotriazole-5-methylcarboxylate, 3-amino-1,2,4-triazole, 4-amino-1,2,4-triazole, 5-amino-1,2,4-triazole, 3-mercapto-1,2,4-triazole, chlorobenzotriazole, nitrobenzotriazole, aminobenzotriazole, cyclohexano[1,2-d]triazole, 4,5,6,7-tetrahydroxytolyltriazole, 1-hydroxybenzotriazole, ethylbenzotriazole, naphthotriazole, 1-N,N-bis(2-ethylhexyl)-[(1,2,4-triazole-1-yl) methyl]amine, 1-[N,N-bis(2-ethylhexyl)aminomethyl] benzotriazole, 1-[N,N-bis(2-ethylhexyl)aminomethyl] tolyltriazole, 1-[N,N-bis(2-ethylhexyl)aminomethyl] carboxybenzotriazole, 1-[N,N-bis(2-hydroxyethyl)-aminomethyl]benzotriazole, 1-[N,N-bis(2-hydroxyethyl)-aminomethyl]tolyltriazole, 1-[N,N-bis(2-hydroxyethyl)-aminomethyl]carboxybenzotriazole, 1-[N,N-bis(2-hydroxypropyl)aminomethyl]carboxybenzotriazole, 1-[N,N-bis(1-butyl)aminomethyl]carboxybenzotriazole, 1-[N,N-bis(1-octyl)aminomethyl]carboxybenzotriazole, 1-(2',3'-dihydroxypropyl)benzotriazole, 1-(2',3'-di-carboxyethyl) benzotriazole, 2-(2'-hydroxy-3',5'-di-tert-butylphenyl) benzotriazole, 2-(2'-hydroxy-3',5'-amylphenyl)

benzotriazole, 2-(2'-hydroxy-4'octoxyphenyl)benzotriazole, 2-(2'-hydroxy-5'-tert-butylphenyl)benzotriazole, 1-hydroxybenzotriazole-6-carboxylic acid, 1-oleoylbenzotriazole, 1,2,4-triazole-3-ole, 5-amino-3-mercapto-1,2,4-triazole, 5-amino-1,2,4-triazole-3-carboxylic acid, 1,2,4-triazole-3-carboxamide, 4-aminourazole, and 1,2,4-triazole-5-one. The content of this benzotriazole compound is not particularly limited but is an amount in a range from 0.01 ppm to 3% and preferably in a range from 0.1 ppm to 1% of the composition in terms of mass units.

The present composition is such that curing occurs either at room temperature or under heating, but it is preferable to heat the composition in order to achieve rapid curing. The heating temperature is preferably from 50 to 200° C.

The optical semiconductor device of the present invention will now be explained in detail.

The optical semiconductor device of the present invention is produced by encapsulating an optical semiconductor element with a cured product of the curable silicone composition described above. Examples of such an optical semiconductor device of the present invention include a light emitting diode (LED), a photocoupler, and a CCD. Examples of optical semiconductor elements include light emitting diode (LED) chips and solid-state image sensing devices.

FIG. 1 illustrates a cross-sectional view of a single surface mounted type LED, which is one example of the optical semiconductor device of the present invention. In the LED illustrated in FIG. 1, a light emitting element (LED chip) 1 is die-bonded to a lead frame 2, and the light emitting element (LED chip) 1 and a lead frame 3 are wire-bonded by a bonding wire 4. A frame material 5 is provided around the periphery of this light emitting element (LED chip) 1, and the light emitting element (LED chip) 1 on the inner side of this frame material 5 is encapsulated by a cured product 6 of the curable silicone composition of the present invention.

An example of a method for producing the surface mounted type LED illustrated in FIG. 1 is a method comprising die-bonding the light emitting element (LED chip) 1 to the lead frame 2, wire-bonding this light emitting element (LED chip) 1 and the lead frame 3 by means of a gold bonding wire 4, charging the curable silicone composition of the present invention inside the frame material 5 provided around the periphery of the light emitting element (LED chip) 1, and then curing the curable silicone composition by heating to 50 to 200° C.

EXAMPLES

The curable silicone composition and the optical semiconductor device of the present invention will be described in detail hereinafter using examples. Note that values of viscosity in the examples are the values at 25° C., and Me represents a methyl group, Vi represents a vinyl group, Ph represents a phenyl group, and Ep represents a 3-glycidoxypropyl group. The characteristics of the cured product of the curable silicone composition were measured as follows.

Transmittance

Each of the curable silicone compositions shown in Table 1 was poured into a mold measuring 100 mm long×10 mm wide×4 mm thick, and cured by heating at 150° C. for 120 minutes. The produced cured product test piece was put in a quartz cell, and transmittance of 450 nm was determined by measuring the transmission spectrum using an automatic spectrophotometer.

Adhesive Strength
Adhesive Strength of Cured Product of Curable Silicone Composition A polytetrafluoroethylene resin spacer (10 mm wide, 20 mm long, 1 mm wide) was sandwiched between two aluminum sheets, silver sheets, or polyphthalamide sheets (25 mm wide, 75 mm long, 1 mm thick), and the gap was filled with the curable silicone composition. It was held with a clip, and a test piece was made by curing by heating for 1 hour in a circulating hot air oven at 150° C. After it was cooled to room temperature, the clip and spacer were removed and shear adhesive strength of the cured product was measured using a tensile tester.

Production of Surface Mounted Type Light Emitting Diode (LED)

In a cylindrical frame 5 that was made from polyphthalamide (PPA) resin and that had a closed bottom (inner diameter: 2.0 mm; depth: 1.0 mm), lead frames 2 and 3 were extended from side walls of the frame 5 toward the center of inner bottom of the frame 5. An LED chip 1 was mounted on the central part of the lead frame 2, and the LED chip 1 and the lead frame 3 were electrically connected by a bonding wire 4 in an unencapsulated optical semiconductor device. The curable silicone composition was then cured by heating for 30 minutes at 100° C. and then heating for 1 hour at 150° C. in a heating oven, and the surface mounted type light emitting diodes (LED) shown in FIG. 1 were produced.

Thermal Shock Test

Sixteen light emitting diodes produced by the above method were subjected to 750 cycles of a thermal shock test in which one cycle consisted of holding for 30 minutes at −40° C. and then holding for 30 minutes at 120° C. (−40° C.↔120° C.). They were then returned to room temperature (25° C.), and an illumination test was performed to check for the passage of current. The proportion of LEDs in which the wire was disconnected (number disconnected/16 LEDs) is shown in Table 1.

Reference Example 1

In a reaction container equipped with a stirrer, a reflux condenser, and a thermometer, 148.5 g (0.75 mol) of phenyltrimethoxysilane, 43.0 g (0.5 mol) of cyclic vinylmethylcyclosiloxane, and 0.11 g of trifluoromethanesulfonic acid were loaded, and 21 g of water was added. This was then refluxed for 2 hours, and low boiling point components were removed. Then, after the reaction system was cooled, toluene and potassium hydroxide aqueous solution were added. After that, 88.1 g (0.4 mol) of 3-glycidoxypropyl methyldimethoxysilane and 14.4 g of water were added. After refluxing for 1 hour, methanol was distilled off, and the excess water was removed by azeotropic dehydration. After heat-refluxing for 5 hours, the toluene solution was cooled, neutralized with 1.1 g of acetic acid, and washed with water three times. After the water was removed, toluene was distilled off under reduced pressure, and an adhesion promoter having a viscosity of 25.3 Pas and represented by the average unit formula:

(PhSiO$_{3/2}$)$_{0.45}$(MeViSiO$_{2/2}$)$_{0.30}$(MeEpSiO$_{2/2}$)$_{0.25}$ was prepared.

Reference Example 2

In a reaction container equipped with a stirrer, a reflux condenser, and a thermometer, 148.5 g (0.75 mol) of phenyltrimethoxysilane, 64.5 g (0.75 mol) of cyclic vinylmethylcyclosiloxane, and 0.11 g of trifluoromethanesulfonic acid were loaded, and 21.2 g of water was added. This was then refluxed for 2 hours, and low boiling point components were removed. Then, after the reaction system was cooled, toluene and potassium hydroxide aqueous solution were added. After that, 88.1 g (0.4 mol) of 3-glycidoxypropyl methyldimethoxysilane and 14.4 g of water were added. After refluxing for 1 hour, methanol was distilled off, and the excess water was removed by azeotropic dehydration. After heat-refluxing for 5 hours, the toluene solution was cooled, neutralized with 1.1 g of acetic acid, and washed with water three times. After the water was removed, toluene was distilled off under reduced pressure, and an adhesion promoter having a viscosity of 21.1 Pa·s and represented by the average unit formula:

$(PhSiO_{3/2})_{0.39}(MeViSiO_{2/2})_{0.40}(MeEpSiO_{2/2})_{0.21}$ was prepared.

Reference Example 3

In a reaction container equipped with a stirrer, a reflux condenser, and a thermometer, 148.5 g (0.75 mol) of phenyltrimethoxysilane, 21.5 g (0.25 mol) of cyclic vinylmethylcyclosiloxane, and 0.11 g of trifluoromethanesulfonic acid were loaded, and 21.2 g of water was added. This was then refluxed for 2 hours, and low boiling point components were removed. Then, after the reaction system was cooled, toluene and potassium hydroxide aqueous solution were added. After that, 88.1 g (0.4 mol) of 3-glycidoxypropyl methyldimethoxysilane and 14.4 g of water were added. After refluxing for 1 hour, methanol was distilled off, and the excess water was removed by azeotropic dehydration. After heat-refluxing for 5 hours, the toluene solution was cooled, neutralized with 1.1 g of acetic acid, and washed with water three times. After the water was removed, toluene was distilled off under reduced pressure, and an adhesion promoter having a viscosity of 29.1 Pa·s and represented by the average unit formula:

$(PhSiO_{3/2})_{0.54}(MeViSiO_{2/2})_{0.18}(MeEpSiO_{2/2})_{0.28}$ was prepared.

Reference Example 4

In a 4-necked flask equipped with a stirrer, a reflux condenser, and a thermometer, 82.2 g (0.44 mol) of 1,3-divinyl-1,1,3,3-tetramethyldisiloxane, 143 g of water, 0.38 g of trifluoromethanesulfonic acid, and 500 g of toluene were loaded, and while the mixture was being stirred, 524.7 g (2.65 mol) of phenyltrimethoxysilane was added dropwise over 1 hour. After completion of the addition, the mixture was heat-refluxed for 1 hour. The mixture was then cooled, and after the bottom layer was separated, the toluene solution layer was washed with water three times. To the water-washed toluene solution layer, 314 g (1.42 mol) of 3-glycidoxypropyl methyldimethoxysilane, 130 g of water, and 0.50 g of potassium hydroxide were added, and the mixture was heat-refluxed for 1 hour. Methanol was then distilled off, and the excess water was removed by azeotropic dehydration. After heat-refluxing for 4 hours, the toluene solution was cooled, neutralized with 0.55 g of acetic acid, and washed with water three times. After the water was removed, toluene was distilled off under reduced pressure, and an adhesion promoter having a viscosity of 8,500 mPa·s and represented by the average unit formula:

$(PhSiO_{3/2})_{0.53}(Me_2ViSiO_{1/2})_{0.18}(EpMeSiO_{2/2})_{0.29}$ was prepared.

Examples 1 to 4, Comparative Example 1

The curable silicone compositions having the compositions shown in Table 1 were prepared using the components mentioned below. Moreover, in Table 1, the content of component (D) is expressed in terms of the content (ppm in terms of mass units) of platinum metal relative to the curable silicone composition. Note that the H/Vi in Table 1 refer to the number of moles of silicon-bonded hydrogen atoms contained in component (B) relative to 1 mole of total alkenyl groups contained in components (A) and (C).

The following components were used as component (A).
Components (A-1): organopolysiloxane represented by the average unit formula:

$(Me_2ViSiO_{1/2})_{0.20}(PhSiO_{3/2})_{0.80}$

Component (A-2): organopolysiloxane represented by the average unit formula:

$(MePhViSiO_{1/2})_{0.23}(PhSiO_{3/2})_{0.77}$

Component (A-3): methylphenylpolysiloxane capped at both molecular terminals with dimethylvinylsiloxy groups and having a viscosity of 3,000 mPa·s at 25° C.

The following component was used as component (B).
Component (B-1): organotrisiloxane having a viscosity at 25° C. of 4 mPa·s and represented by the formula:

$HMe_2SiOPh_2SiOSiMe_2H$

The following components were used as component (C).
Component (C-1): adhesion promoter prepared in Reference Example 1
Component (C-2): adhesion promoter prepared in Reference Example 2
Component (C-3): adhesion promoter prepared in Reference Example 3
Component (C-4): adhesion promoter prepared in Reference Example 4

The following component was used as component (D).
Component (D-1): solution of a platinum-1,3-divinyl-1,1,3,3-tetramethyldisiloxane complex in 1,3,5,7-tetramethyl-1,3,5,7-tetravinylcyclotetrasiloxane (solution containing 0.1 mass % of platinum)

The following component was used as component (E).
Component (E-1): 1-ethynylcyclohexanol

TABLE 1

| | | Category Present invention | | | |
|---|---|---|---|---|---|
| | Item | Example 1 | Example 2 | Example 3 | Example 4 |
| Composition of curable silicone | Component (A-1) | 60 | 60 | 60 | — |
| | Component (A-2) | — | — | — | 60 |
| | Component (A-3) | 15 | 15 | 15 | 17 |

TABLE 1-continued

| | | | | | |
|---|---|---|---|---|---|
| composition (part by mass) | Component (B-1) | 18.5 | 18.5 | 18.5 | 21 |
| | Component (C-1) | 1 | — | — | 1 |
| | Component (C-2) | — | 1 | — | — |
| | Component (C-3) | — | — | 1 | — |
| | Component (C-4) | — | — | — | — |
| | Component (D-1) | 2.5 ppm | 2.5 ppm | 2.5 ppm | 2.5 ppm |
| | Component (E-1) | 0.04 | 0.04 | 0.04 | 0.04 |
| H/Vi | | 1 | 1 | 1 | 1 |
| Hardness (Shore D) | | 50 | 48 | 48 | 48 |
| Transmittance | | | | | |
| Initial | | 97 | 97 | 98 | 98 |
| After 500 hours at 150° C. | | 95 | 95 | 95 | 95 |
| Adhesive strength (MPa) | | | | | |
| Aluminum sheet | | 9 | 9 | 9 | 9 |
| Silver sheet | | 10 | 8 | 8 | 8 |
| Thermal shock test | | 0/16 | 0/16 | 0/16 | 0/16 |

| | | Category Comparative Example | | |
|---|---|---|---|---|
| Item | | Comparative Example 1 | Comparative Example 2 | Comparative Example 3 |
| Composition of curable silicone composition part by (mass) | Component (A-1) | 60 | 60 | — |
| | Component (A-2) | — | — | 60 |
| | Component (A-3) | 15 | 15 | 17 |
| | Component (B-1) | 18.5 | 18.5 | 21 |
| | Component (C-1) | — | — | — |
| | Component (C-2) | — | — | — |
| | Component (C-3) | — | — | — |
| | Component (C-4) | 1 | 2.5 | 2.5 |
| | Component (D-1) | 2.5 ppm | 2.5 ppm | 2.5 ppm |
| | Component (E-1) | 0.04 | 0.04 | 0.04 |
| H/Vi | | 1 | 1 | 1 |
| Hardness (Shore D) | | 47 | 45 | 48 |
| Transmittance | | | | |
| Initial | | 97 | 97 | 98 |
| After 500 hours at 150° C. | | 88 | 85 | 85 |
| Adhesive strength (MPa) | | | | |
| Aluminum sheet | | 6 | 7 | 6 |
| Silver sheet | | 6 | 6 | 6 |
| Thermal shock test | | 14/16 | 10/16 | 10/16 |

INDUSTRIAL APPLICABILITY

The curable silicone composition of the present invention can be used as an adhesive, a potting agent, a protective agent, a coating agent, or an underfill agent for electrical/electronic use. In particular, the curable silicone composition has high reactivity and can form a cured product with low gas permeability, so the composition is suitable as a sealing agent or a protective coating material for an optical semiconductor element in an optical semiconductor device such as a light emitting diode (LED).

DESCRIPTION OF SYMBOLS

1 Light emitting element
2 Lead frame
3 Lead frame
4 Bonding wire
5 Frame material
6 Cured product of curable silicone composition

The invention claimed is:

1. A curable silicone composition comprising:
   (A) 100 parts by mass of an organopolysiloxane having at least two alkenyl groups in a molecule;
   (B) an organohydrogenpolysiloxane having at least two silicon-bonded hydrogen atoms in a molecule, in an amount providing from 0.1 to 10.0 moles of silicon-bonded hydrogen atoms relative to 1 mole of total alkenyl groups contained in components (A) and (C);
   (C) from 0.1 to 50 parts by mass of an adhesion promoter represented by the average unit formula:

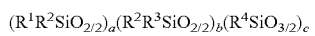
   $(R^1R^2{}_2SiO_{1/2})_a(R^2R^3SiO_{2/2})_b(R^4SiO_{3/2})_c$ wherein, $R^1$ is an alkenyl group having from 2 to 12 carbons; $R^2$ are the same or different alkyl groups each having from 1 to 12 carbons, aryl groups each having from 6 to 20 carbons, or aralkyl groups each having from 7 to 20 carbons; $R^3$ is an epoxy group-containing organic group; $R^4$ is an aryl group having from 6 to 20 carbons or an aralkyl group having from 7 to 20 carbons; and a, b, and c are numbers satisfying: $0.1 \leq a \leq 0.6$, $0.1 \leq b \leq 0.5$, $0.3 \leq c < 0.8$, $0.15 \leq a/c \leq 1.5$, $0.15 \leq b/c \leq 1.8$, and $a+b+c=1$; and
   (D) a hydrosilylation reaction catalyst in an amount effective in accelerating curing of the composition.

2. The curable silicone composition according to claim 1, wherein component (A) contains an organopolysiloxane resin having at least two alkenyl groups in a molecule and represented by the average unit formula:

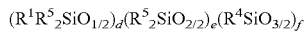
$(R^1R^5{}_2SiO_{1/2})_d(R^5{}_2SiO_{2/2})_e(R^4SiO_{3/2})_f$ wherein, $R^1$ and $R^4$ are the same groups as defined above; $R^5$ are the same or different alkyl groups each having from 1 to 12 carbons, alkenyl groups each having from 2 to 12 carbons, aryl groups each having from 6 to 20 carbons, or aralkyl groups each having from 7 to 20 carbons; and d, e, and f are numbers satisfying: $0.01 \leq d \leq 0.5$, $0 \leq e \leq 0.7$, $0.1 \leq f < 0.9$, and $d+e+f=1$.

3. The curable silicone composition according to claim 2, wherein component (A) contains a straight-chain organopolysiloxane having at least two silicon-bonded alkenyl groups and at least one silicon-bonded aryl group in a molecule.

4. The curable silicone composition according to claim 1, wherein component (A) contains a straight-chain organopolysiloxane having at least two silicon-bonded alkenyl groups and at least one silicon-bonded aryl group in a molecule.

5. The curable silicone composition according to claim 4, wherein $R^3$ in component (C) is a glycidoxyalkyl group, an epoxycyclohexylalkyl group, or an epoxyalkyl group.

6. The curable silicone composition according to claim 1, wherein $R^3$ in component (C) is a glycidoxyalkyl group, an epoxycyclohexylalkyl group, or an epoxyalkyl group.

7. The curable silicone composition according to claim 1, further comprising (E) a hydrosilylation reaction inhibitor in an amount from 0.01 to 3 parts by mass per 100 parts by mass total of components (A) to (D).

8. An optical semiconductor device comprising an optical semiconductor element encapsulated by a cured product of the curable silicone composition according to claim 1.

* * * * *